(12) United States Patent
Larsen

(10) Patent No.: US 6,484,299 B1
(45) Date of Patent: Nov. 19, 2002

(54) METHOD AND APPARATUS FOR PCB ARRAY WITH COMPENSATED SIGNAL PROPAGATION

(75) Inventor: Corey L. Larsen, Marsing, ID (US)

(73) Assignee: Micron Technology, Inc., Boise, ID (US)

( * ) Notice: Subject to any disclaimer, the term of this patent is extended or adjusted under 35 U.S.C. 154(b) by 164 days.

(21) Appl. No.: 09/612,155

(22) Filed: Jul. 7, 2000

(51) Int. Cl.[7] .............................................. G06F 17/50
(52) U.S. Cl. ..................... 716/6; 716/4; 716/5; 716/15
(58) Field of Search .......................... 716/6, 4, 5, 8–15; 702/117, 89; 438/633, 598, 599, 404; 711/170; 333/12, 18, 142; 327/276, 277, 262; 29/829

(56) References Cited

U.S. PATENT DOCUMENTS

| | | | | |
|---|---|---|---|---|
| 5,785,789 A | * | 7/1998 | Gagnon et al. | 156/235 |
| 5,839,188 A | * | 11/1998 | Pommer | 29/830 |
| 5,892,384 A | * | 4/1999 | Yamada et al. | 327/277 |
| 5,926,397 A | * | 7/1999 | Yamanouchi | 364/491 |
| 5,929,199 A | * | 7/1999 | Snow et al. | 528/288 |
| 5,945,886 A | * | 8/1999 | Millar | 333/1 |
| 5,949,657 A | * | 9/1999 | Karabatsos | 361/803 |
| 6,215,372 B1 | * | 4/2001 | Novak | 333/12 |
| 6,278,239 B1 | * | 8/2001 | Caporaso et al. | 315/5.41 |
| 6,291,339 B1 | * | 9/2001 | Avanzino et al. | 438/633 |
| 6,324,485 B1 | * | 11/2001 | Ellis | 702/117 |
| 6,374,338 B1 | * | 4/2002 | Garvey | 711/170 |
| 6,376,634 B1 | * | 4/2002 | Nishikawa et al. | 528/25 |

OTHER PUBLICATIONS

Sim et al, "Modeling of PCB Variations and its Impact on Microcontroller Immunity," IEEE, SEP 1997, pp. 100–104.*

Shi et al, "Modeling Multilayered PCB Power–Bus Designs Using an MPIE Based Circuit Extraction Technique," IEEE, 1998, pp. 647–651.*

* cited by examiner

*Primary Examiner*—Vuthe Siek
(74) *Attorney, Agent, or Firm*—TraskBritt

(57) ABSTRACT

A method and apparatus for compensating propagation delay in an electronic system relating to corresponding signals becoming skewed by variations in the dielectric materials over which the respective, corresponding signals travel. Compensation for the propagation delay is done by selecting printed circuit boards which each have one side comprised of a dielectric substrate material exhibiting a first dielectric constant and another side comprised of a dielectric substrate material exhibiting a second dielectric constant. By transmitting each of the corresponding signals across a side of a printed circuit board with a first dielectric constant and a side with a second dielectric constant, the signals are each delayed substantially the same by the effects of the dielectric constant, reducing the skew to zero. In specific application, the printed circuit boards are most easily matched by selecting printed circuit boards from a common printed circuit board panel or array. The invention has particular application in source synchronous device systems such as an RDRAM® system.

41 Claims, 7 Drawing Sheets

METHOD AND APPARATUS FOR PCB ARRAY WITH COMPENSATED SIGNAL PROPAGATION

BACKGROUND OF THE INVENTION

1. Field of the Invention

The present invention relates generally to a method and apparatus for compensating or deskewing signal propagation within a printed circuit board ("PCB"). More particularly, the present invention relates to aligning both the rising and falling edges of the system clock, the control signals and the data input and output separately using signal delay elements.

2. State of the Art

As the complexity and data processing speeds of electronic products continue to increase, the properties of the interconnecting circuitry which connects complex and high-speed integrated circuit devices become more pronounced and must be more carefully analyzed and characterized to ensure reliable circuit performance. This increases the cost of fabricating the devices, particularly with regard to the interconnecting circuitry. The data processing speeds obtainable with advanced high-speed integrated circuit devices often dictate the required characteristics of the interconnecting circuitry, and thus can significantly increase the cost of such devices. Currently, integrated circuit devices may operate with a throughput in gigabits per second resulting in pulse durations of less than a nanosecond and rise times in the picosecond range. Under these conditions, even the conductors connecting components within these devices effectively become active components in the circuits, both in terms of affecting propagation delays and impedance matching. Logic circuits are not capable of high-speed circuit operations unless the effects of signal transmission propagation delay are somehow controlled.

Propagation delays are affected by interconnecting circuitry such as printed circuit boards and assemblies, principally as a result of the dielectric constant ($\in_r$) of the materials used in the circuitry. In particular, materials having low dielectric constants are desirable as they minimize propagation delays and thereby increase the range of obtainable signal speeds within a circuit.

Impedance, which is also a function of the dielectric constant ($\in_r$) of the material used in the circuitry, also affects the obtainable signal speeds within a circuit. Impedance is principally the combination of resistance, capacitance and inductance which create electric and magnetic fields in a circuit. The impedance of a circuit is also called the characteristic impedance, as it depends solely on the characteristics of the materials used and their spacial relationship. Factors such as the dielectric constants of circuit materials and the widths of conductive signal traces primarily affect the characteristic impedance of an electronic circuit.

Matching the impedances of interconnecting circuitry with that of other electronic devices and connectors is often done in an attempt to ensure signal integrity in a circuit. This is because, particularly at high frequencies, signals may be reflected when impedance mismatches are present in a circuit. Such mismatches distort signals, increase rise times, and otherwise generate errors in data transmission. Consequently, impedance matching is often necessary to provide maximum power transfer between the connected electronic components and systems and to prevent signal reflections from forming along the signal paths.

As noted above, impedance in a printed circuit is directly related to the separation between signal traces separated by an insulating layer, as well as to the dielectric constant of the material in the insulating layer. The impedance of a given printed circuit board trace where the width is greater than the height of the trace are described by the following equations:

$$Zo=120\pi/[(W_{\mathit{eff}}/h)+1.393+0.667*ln[(W_{\mathit{eff}}/h)+1.44]]*(\in_{\mathit{eff}})^{1/2}$$

$$\in_{\mathit{eff}}=[(\in_r+1)/2]+[(\in_r-1)/2]*[1+((12*h)/w)]^{-1/2}-[[(\in_r-1)*(t/h)]/[4.6*(w/h)^{1/2}]]; \text{ and}$$

$$W_{\mathit{eff}}=w+[1.25*t/\pi]*[1+ln[2*h/t]];$$

where:

Zo=Characteristic impedance;

$\in_{\mathit{eff}}$=Effective permittivity of a microstrip trace;

$W_{\mathit{eff}}$=Effective width of a microstrip trace;

$\in_r$=Relative permittivity of material between trace and ground plane;

h=Trace height over ground;

w=Trace width; and t=Trace thickness.

Propagation delay, which is also related to the characteristics of the printed circuit board components, is described by the following equation:

$$Vp=84.72*10^{-12}*(\in_{\mathit{eff}})^{1/2},$$

where

Vp=Propagation delay; and $\in_{\mathit{eff}}$=Effective permittivity of a micro strip trace.

One approach to the problem of managing propagation delay is to form expensive six or eight layer printed circuit boards which internally cancel propagation delay. However, there have also been numerous other approaches to controlling propagation delay, some of which include controlling or matching impedance in more simple four layer printed circuit boards.

U.S. Pat. No. 5,892,384 to Yamada et al. (Apr. 6, 1999) discloses a timing signal generation delay circuit to delay and transmit the clock signal after it detects propagation delay differences, also called skew, from a phase shift between two compared signals. By realigning the phases of the two signals by delaying one, the skew between the signals can be adjusted.

U.S. Pat. No. 5,926,397 to Yamanouchi (Jul. 20, 1999) discloses a series of individually tailored delay adjusting elements or cells to be inserted in relay spots within a system after considering the resistance, capacitance and inductance effects of the wires on the propagation delay.

U.S. Pat. No. 5,839,188 to Pommer (Nov. 24, 1998) discloses a specialized adhesive material to control the separation between printed circuit boards in multilayer circuit board applications to control propagation delay.

U.S. Pat. No. 5,929,199 to Snow et al. (Jul. 27, 1999) discloses a specific process for lowering the dielectric constant of a polymer and using that polymer in a printed circuit to reduce propagation delay.

U.S. Pat. No. 5,785,789 to Gagnon et al. (Jul. 28, 1998) discloses multilayer printed circuit board structures having partially cured, microsphere-filled resin layers which lower the dielectric constant of the overall structure to reduce propagation delay.

U.S. Pat. No. 5,945,886 to Millar (Aug. 31, 1999) discloses a method of reducing propagation delay by matching the impedance between two lines by matching the electrical lengths of the traces on a circuit board.

Although the prior art approaches to the problem of reducing propagation delay will each likely have an effect on propagation delay, each of these approaches also requires additional or specially tailored parts and layers, or processes which significantly add to the cost of fabricating the printed circuit board. Furthermore, the prior art methods do not consider varied characteristics within a circuit board, or differences between circuit boards, for a signal that crosses multiple circuit boards such as in the circuit configuration employed with a Rambus® dynamic random access memory ("RDRAM").

SUMMARY OF THE INVENTION

The present invention addresses the problem of signal skew caused by variations in the propagation delay of corresponding signals in an electronic system. In a first embodiment of the invention, a plurality of printed circuit boards ("PCBs") for use in memory modules are defined upon a common PCB array. The PCBs are laid out such that both a plurality of the sides of the PCBs which will be used for both the first sides of memory modules and a plurality of the sides of other PCBs which will be used for the second sides of memory modules are on the common first side of the array. The corresponding second side of the PCB array also includes PCBs respectively corresponding to the PCBs on the first side. The PCB arrays are then cut into individual PCBs or memory modules. Two PCBs or memory modules are matched and placed in a system such that a first signal which travels from a memory controller and across a side of a first PCB corresponding to the first side of the PCB array also travels across the side of a second PCB corresponding to the second side of the PCB array to terminate at a termination point. Correspondingly, a second signal which originates from a memory controller and travels across the side of the first PCB corresponding to the second side of the PCB array also travels across the side of the second PCB corresponding to the first side of the PCB array before reaching its termination point. In this way, the propagation delay caused by corresponding signals traveling across printed circuit boards made of materials having different dielectric constants respectively is matched or compensated for to substantially eliminate signal skew caused by dielectric constant variations.

In a second embodiment of the invention, a plurality of printed circuit boards ("PCB") arrays are defined upon a common PCB panel. The PCB arrays are arranged such that both a plurality of the sides of the arrays which will be used for the first sides of memory modules and a plurality of the sides of other arrays which will be used for the second sides of memory modules are on the common first side of the panel. The corresponding second side of the panel also includes sides of the arrays respectively corresponding to the sides of the arrays on the first side of the panel. The panels are then cut into individual arrays and further into individual PCBs or memory modules. As in the previous embodiment, two PCBs or memory modules are matched and placed in a system such that a first signal which travels across a side of a first PCB corresponding to the first side of the PCB panel also travels across the side of a second PCB corresponding to the second side of the PCB panel. Correspondingly, a second signal which travels across the side of the first PCB corresponding to the second side of the PCB panel also travels across the side of the second PCB corresponding to the first side of the PCB panel.

In a third embodiment of the invention, rather than using two separate printed circuit boards PCB) or memory modules, a single printed circuit board is used. The printed circuit board, like those in previous embodiments and common in practice, is formed having a dielectric layer on each side of the PCB. A first circuit trace, or other conductive path, extends for a first distance along a first side of the PCB, through a via, and for a second distance on the second side of the PCB. A second circuit trace, or other conductive path, extends for a distance substantially equal to the second distance along the second side of the PCB, through a via, and, for a distance substantially equal to the first distance, continues on the first side of the PCB.

BRIEF DESCRIPTION OF THE SEVERAL VIEWS OF THE DRAWINGS

The nature of the present invention as well as other embodiments of the present invention may be more clearly understood by reference to the following detailed description of the invention, to the appended claims, and to the several drawings herein, wherein:

DETAILED DESCRIPTION OF THE INVENTION

Multilayer printed circuit boards ("PCB") typically comprise layers of resin-impregnated woven glass reinforcement (prepreg) sandwiched between conductive layers of copper foil. The dielectric constant ($\in_r$) of conventional FR4 epoxy resin and that of common woven glass fiber laminate prepregs is generally on the order of about four to six, respectively. For example, a resin/glass fabric laminate, typically contains about forty percent by weight of glass fabric and about sixty percent by weight of an epoxy resin material. Such laminate prepregs feature a dielectric material having a dielectric constant of approximately 4.6. Plain woven glass fabric has a dielectric constant of about 6.1. Typical raw resin has a dielectric constant of about 3.8. Air has a dielectric constant of 1.

Even when using a particular, controlled process for forming a printed circuit board of a particular dielectric material, the dielectric constant of the dielectric material layer disposed between the copper traces and the ground or power layer may typically vary from between 3.8 to 4.8. In some cases, the dielectric constant may even vary as low as 3.0 or as high as 6.0. If a more precise range is desired or required for a particular application, the cost of fabrication and classification increases. As would be expected, the cost significantly increases if an exact match in the dielectric constant of the material between the copper traces and the ground or a power layer is required for each side of the PCB.

Figure 1:
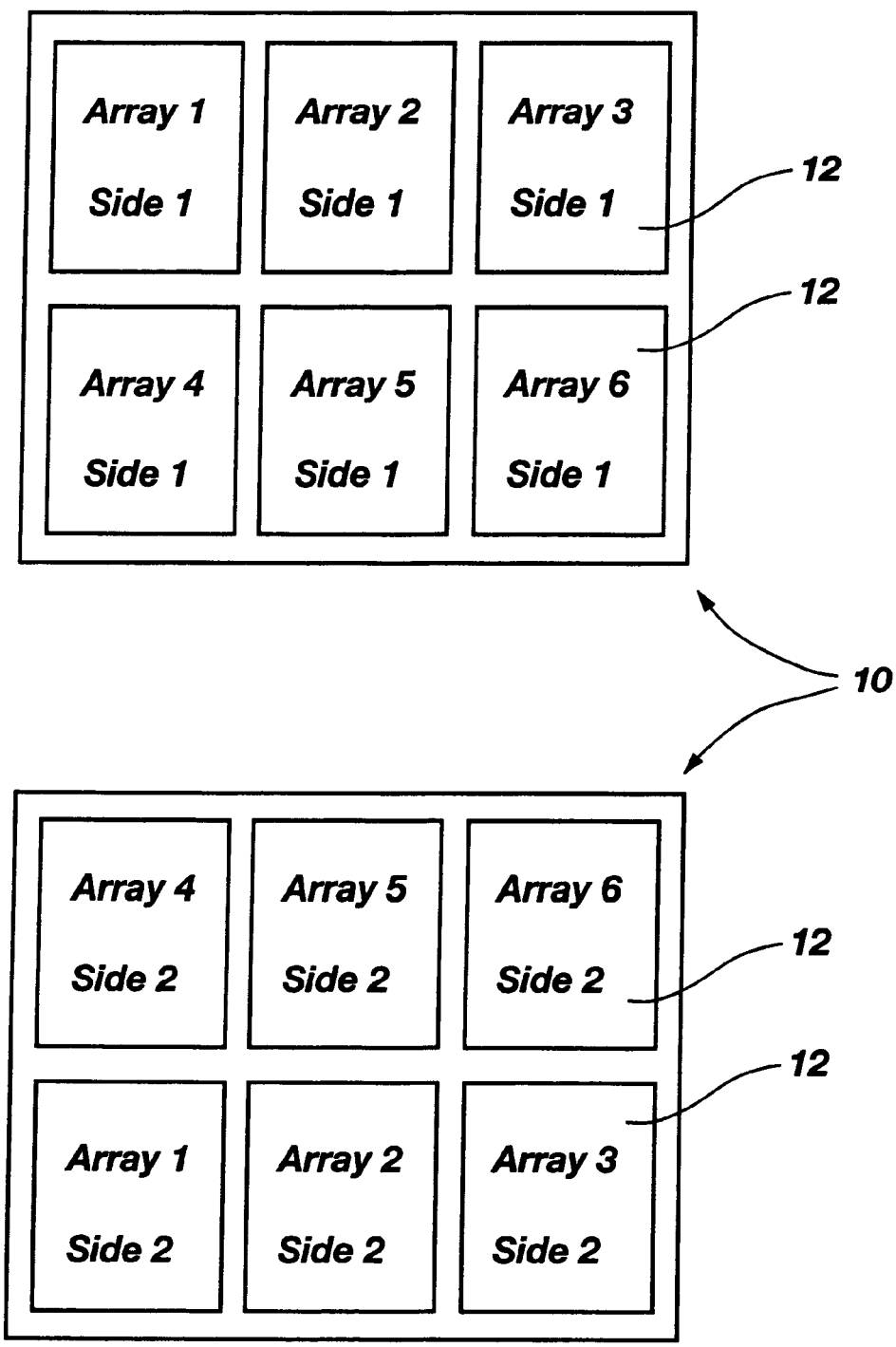
FIG. 1 is an overhead view of both sides of a prior art printed circuit board (PCB) panel layout comprising multiple arrays which, in turn, each comprise multiple PCBs.
Figure 2:
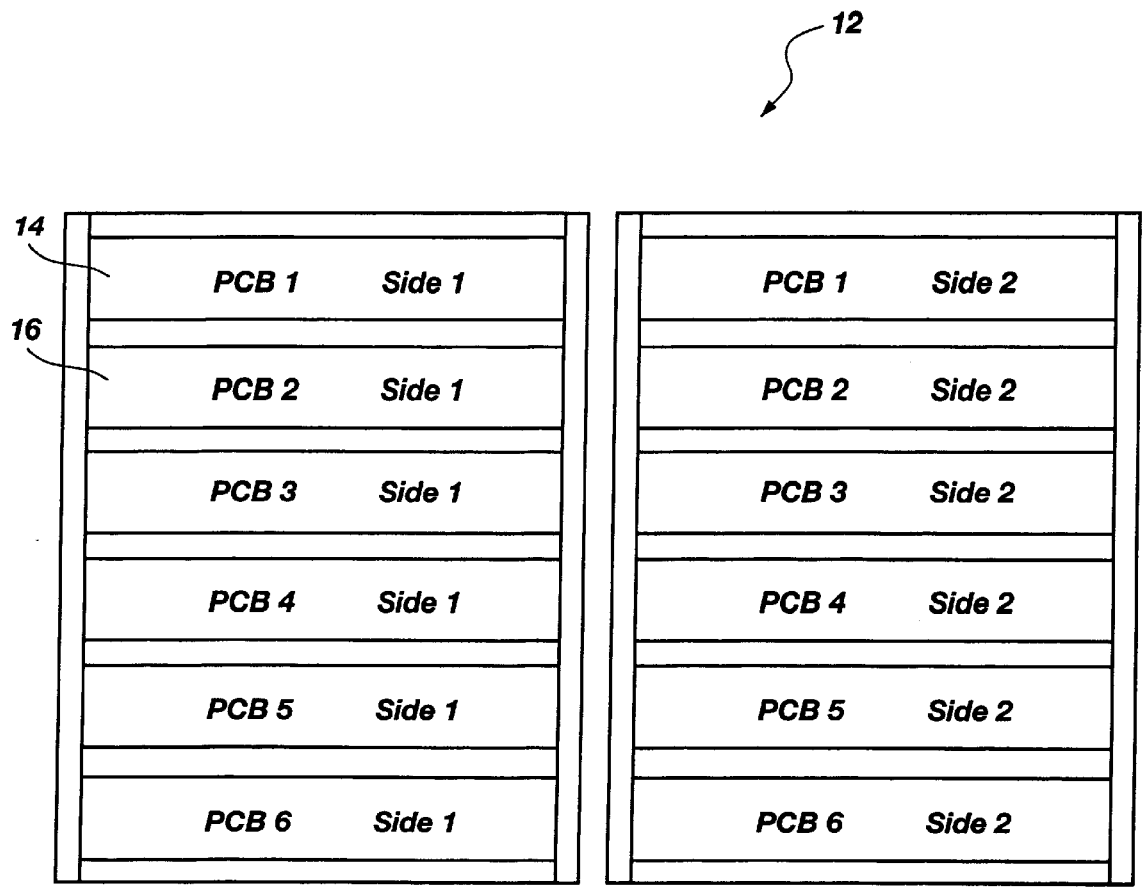
FIG. 2 is an overhead view of both sides of a prior art PCB array layout comprising multiple PCBs.

Multilayer PCBs are typically formed by adhering large sheets of material to surfaces of other large sheets of material to form large multilayer panels. As shown in FIG. 1, these large multilayer panels 10, by design, are then cut into smaller arrays 12. The panel 10, shown in FIG. 1, is a 24"×20" panel, which may be cut to form six smaller arrays 12. Depending upon the application in which the PCB will be used, varying sizes of panels and sizes of arrays are available and well known in the art. FIG. 2 illustrates a layout on an array 12 for forming the array 12 into smaller PCBs such as PCB 1 14 and PCB 2 16. The outermost copper layers on the PCB can be etched in a circuit pattern corresponding to the intended use of the PCB using conventional methods known in the art such as plasma etching and wet etching at the panel level, the array level, or even the PCB level. For efficiency and cost, it is most preferred to etch the traces into the material before they are cut into individual arrays. The PCBs then conventionally have a Rambus memory die attached to them to form RIMM modules for use in two- or three-RIMM module groupings within a Rambus-type system.

Figure 3:
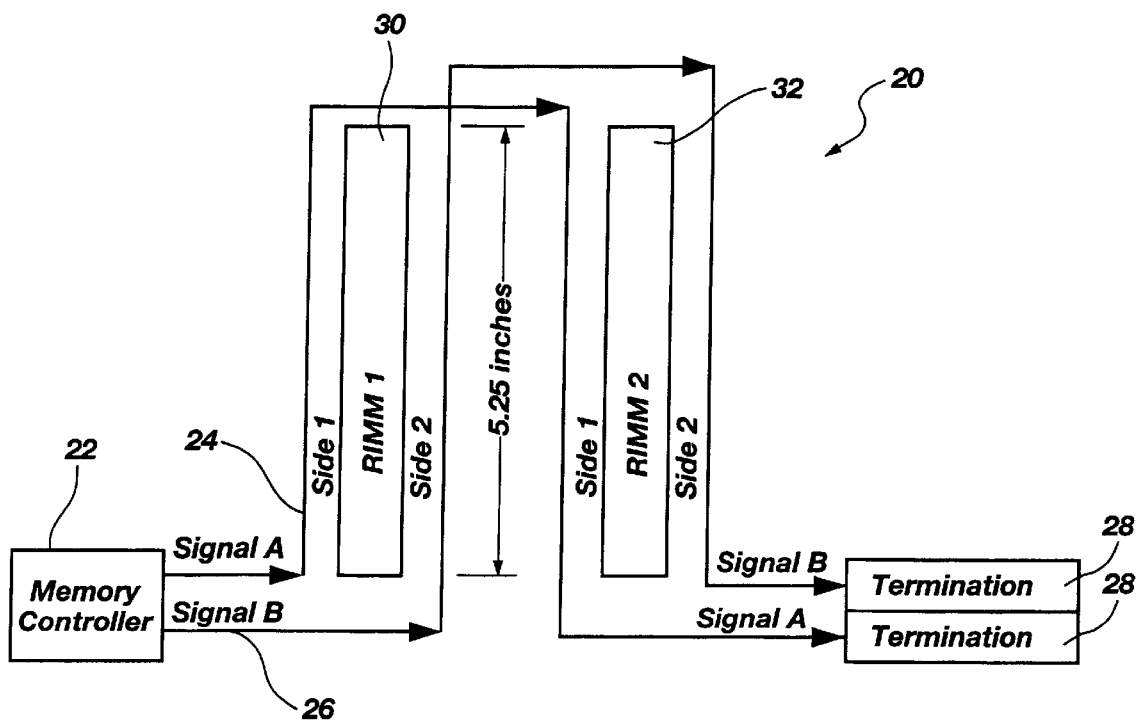
FIG. 3 is a block diagram of a two-RIMM Rambus-type memory system illustrating the routes the signals travel through the individual RIMMs.

FIG. 3 is a block diagram of a two-RIMM Rambus-type system 20 comprising a memory controller 22 having at least two signal paths, Signal A 24 and Signal B 26, a termination 28 for each signal path 24 and 26, and two RIMMs, RIMM 1 30, and RIMM 2 32. The signal paths 24 and 26 are illustrated separate from the RIMMs 30 and 32 for clarity of illustration. However, portions of the signal paths 24 and 26 are, in fact, etched onto the RIMMs 30 and 32 on the respective side nearest the signal path illustrated. As discussed previously, each RIMM is a multilayer RIMM having both a side 1 and a side 2, each of the two sides conventionally having a different dielectric constant associated with it. In a typical Rambus-type system 20, Signal A 24, after it leaves the memory controller 22, travels the length of side 1 of RIMM 1 30 and then the length of side 1 of RIMM 2 32 before reaching its termination 28. Similarly, Signal B 26, after it leaves the memory controller 22, travels the length of side 2 of RIMM 1 30 and then the length of side 2 of RIMM 2 32 before reaching its termination 28.

Figure 4:
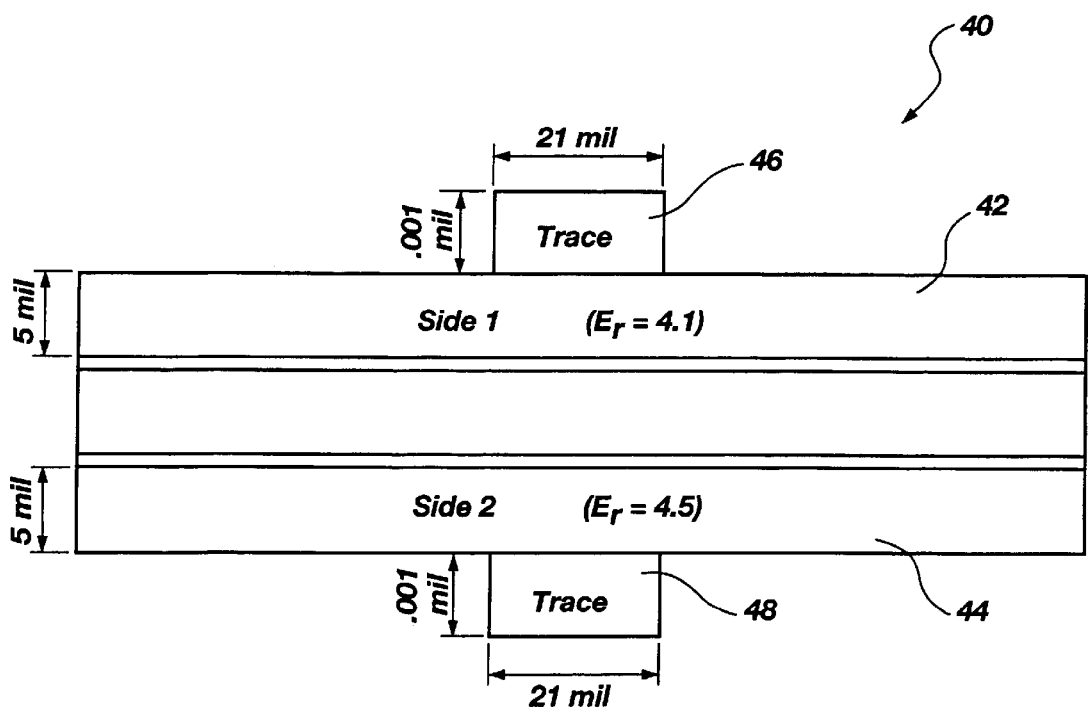
FIG. 4 is a cross-sectional view of a four-layer PCB microstrip.

FIG. 4 depicts a cross-sectional drawing (not-to-scale) of a four-layer PCB microstrip 40 having the characteristics shown. Most significantly, as is typical, Side 1 42 of the PCB microstrip 40 has a different dielectric constant than Side 2 44. As a result, using the propagation delay equations discussed previously and the values shown in FIG. 4, a signal traveling along the trace 46 on Side 1 42 of the PCB microstrip 40 will have a propagation delay of 153.3 ps/in, while a signal traveling along the trace 48 on Side 2 44 of the PCB microstrip 40 will have a propagation delay of 160.0 ps/in. For the two-RIMM Rambus-type system 20 shown in FIG. 3, assuming similar characteristics for both RIMM 1 30 and RIMM 2 32, the difference between the propagation delays of the two signals after each travels the length of a side of each of the two RIMMs is:

$$\begin{aligned}
\text{Total Skew} &= [(\text{RIMM 1/Side 1 Prop. Delay}) * \text{Side 1 length} + \\
&\quad (\text{RIMM 2/Side 1 Prop. Delay}) * \text{Side 1 length}] - \\
&\quad [(\text{RIMM 2/Side 2 Prop. Delay}) * \text{Side 2 length} + \\
&\quad (\text{RIMM 2/Side 2 Prop. Delay}) * \text{Side 2 length}] \\
&= |[(153.3 \text{ ps/in} * 5.25 \text{ in}) + (153.3 \text{ ps/in} * 5.25 \text{ in})] - \\
&\quad [(160.0 \text{ ps/in} * 5.25 \text{ in}) + (160.0 \text{ ps/in} * 5.25 \text{ in})]| \\
&= 70.35 \text{ ps}
\end{aligned}$$

As data speeds become faster, the restrictions on how separated, or skewed, a signal can be from its companion signal becomes more and more significant. For example, the Rambus-type system presently has a maximum skew specification rating of 150 ps. For the system of FIG. 4, at a total skew of 70.35 ps for the signals traveling along only the two RIMMs, the system would quickly exceed the skew indicative of the 150 ps rating.

Figure 5:
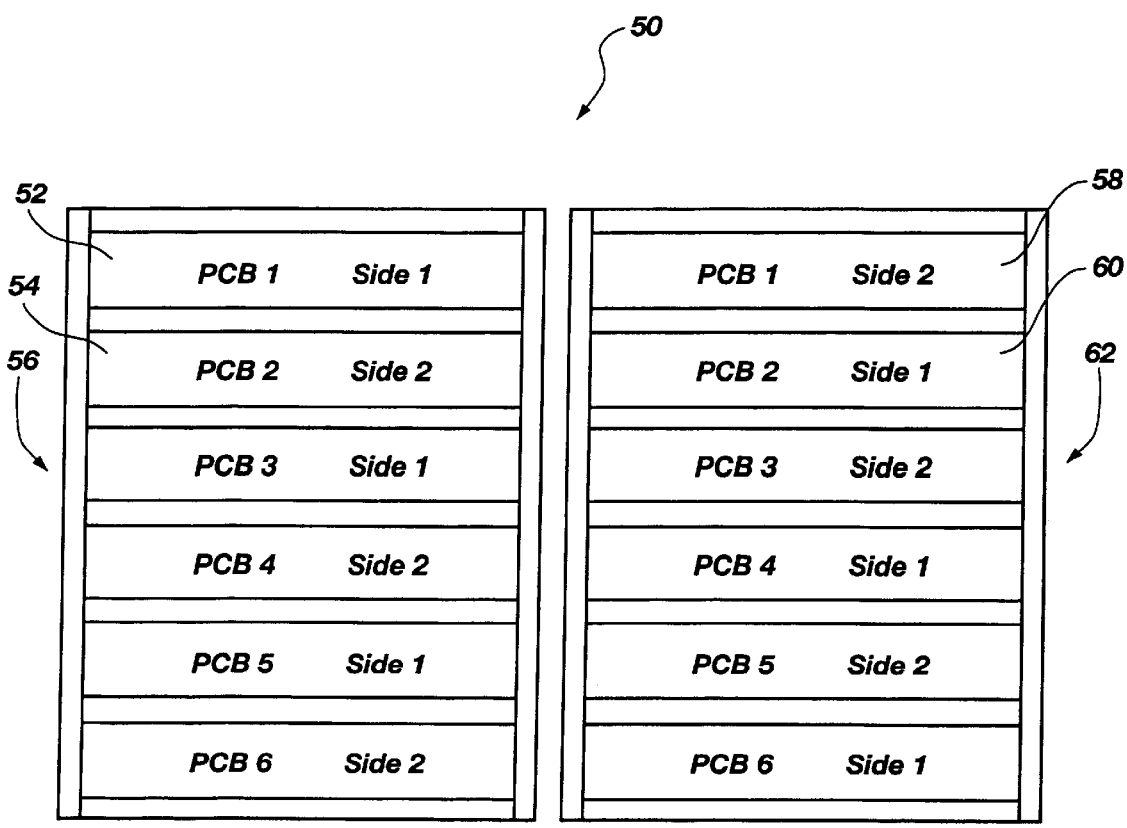
FIG. 5 is an overhead view of a PCB array layout according to a first preferred embodiment of the invention.

The present invention overcomes much of the skew problem by taking advantage of the layout of a typical Rambus-type system and the fairly uniform nature of the dielectric constant ($\in_r$) within a sheet of printed circuit board material. As shown in FIG. 5, according to a first preferred embodiment of the invention, an array 50 is etched and cut in an alternating pattern of traces such that the printed circuit board (PCB) that will be used for Side 1 52 of RIMM 1 and the PCB that will be used for Side 2 54 of RIMM 2 come from the same first side 56 of the array 50 and thus have substantially the same dielectric constant. Furthermore, by default, the PCB that will be used for Side 2 58 of RIMM 1 and the PCB that will be used for Side 1 60 of RIMM 2 come from the same second side 62 of the array 50 and thus also have substantially the same dielectric constant, whether it be the same or different from the dielectric constant of the first side 56 of the array 50.

Under this first preferred embodiment of the invention, when the array laid out in this pattern is cut into a plurality of PCBs, each PCB then having a Rambus die attached and being placed into a Rambus-type system 20 configuration such as that shown in FIG. 3, the propagation delay caused along RIMM 1 30 is compensated for along RIMM 2 32 by eliminating the skew. Thus, the total skew after Signal A 24 and Signal B 26 each travel the lengths of the two RIMMs 30 and 32 is:

$$\begin{aligned}
\text{Total Skew} &= [(\text{RIMM 1/Side 1 Prop. Delay}) * \text{Side 1 length} + \\
&\quad (\text{RIMM 2/Side 1 Prop. Delay}) * \text{Side 1 length}] - \\
&\quad [(\text{RIMM 2/Side 2 Prop. Delay}) * \text{Side 2 length} + \\
&\quad (\text{RIMM 2/Side 2 Prop. Delay}) * \text{Side 2 length}] \\
&= |[(153.3 \text{ ps/in} * 5.25 \text{ in}) + (160.0 \text{ ps/in} * 5.25 \text{ in})] - \\
&\quad [(160.0 \text{ ps/in} * 5.25 \text{ in}) + (153.3 \text{ ps/in} * 5.25 \text{ in})]| \\
&= 0 \text{ ps}
\end{aligned}$$

Because the dielectric constant of the material for Side 1 52 of RIMM 1 30 is substantially the same as the dielectric constant of the material for Side 2 54 of RIMM 2 32, and the dielectric constant of the material for Side 2 58 of RIM:M 1 30 is substantially the same as the dielectric constant of the material for Side 1 60 of RAMM 2 32, each of Signal A 24 and Signal B 26 (FIG. 3) travel the length of a PCB side over a material exhibiting a first dielectric constant and the length of a PCB side over a material exhibiting a second dielectric constant. In this way, the propagation delays are compensated for by the PCB system to cancel the overall skew.

There will, of course, be variances caused by other factors within the system such as neighboring components and paths, and minor variances within the dielectric material of the PCB. However, the substantial effects of the dielectric constant on the propagation delay will, for the most part, be resolved by the present invention.

Figure 6:
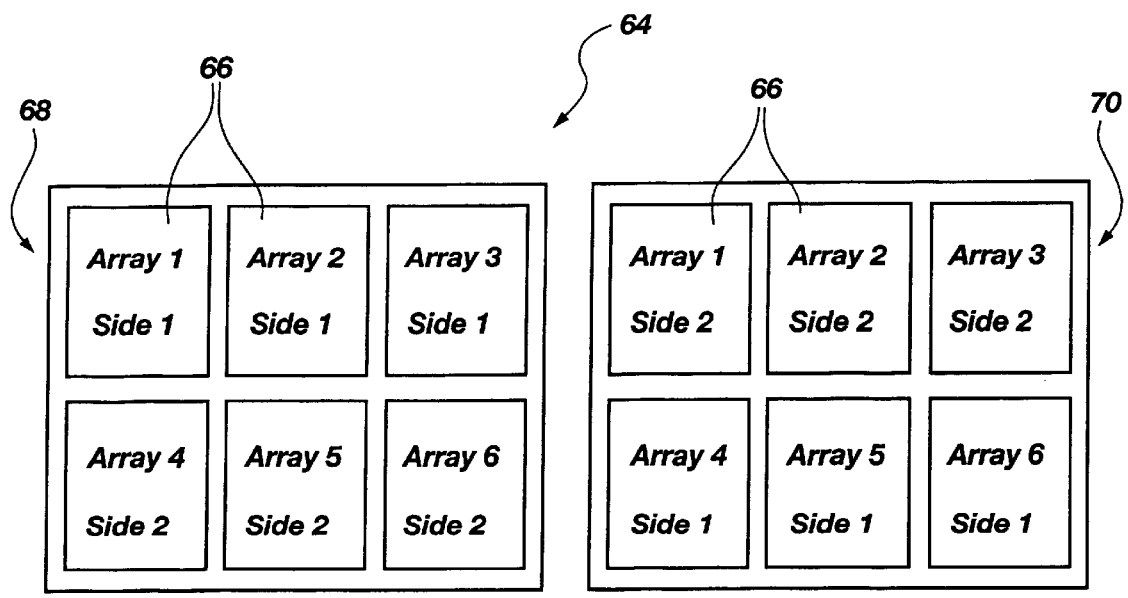
FIG. 6 is an overhead view of a PCB panel layout according to a second preferred embodiment to the invention.

In a second preferred embodiment of the invention, as illustrated in FIG. 6, a printed circuit board (PCB) panel 64 is cut such that half of the arrays 66 on a first side 68 of the panel 64 are patterned as PCBs that will each be used as Side 1 of a RIMM, and half of the arrays 66 are patterned as PCBs that will each be used as Side 2 of a RIMM. Similarly, second side 70 of the panel 64 includes arrays 66 patterned as PCB that will each be used as side 2 of a RIMM, opposite the Side 1 patterns on the first side 68, while the other half of the arrays 66 on the second side 70 lying under the Side 2 patterned arrays on the first side 68 are patterned as Side 1 PCBs. When each of the arrays are cut, individual PCBs, for example, from an array such as array 4 may be matched with the individual PCBs from an array such as array 1. Since a Side 1 of a PCB from array 1 formed on a first side 68 of a panel 64 is matched with Side 1 of a PCB from array 4 formed on a second side 70 of the panel 68 and Side 2 of the PCB from the second side 70 of array 1 is matched with a PCB bearing a Side 2 formed on a first side 68 of array 4, the propagation delays are equalized and skew is cancelled.

Figure 7:
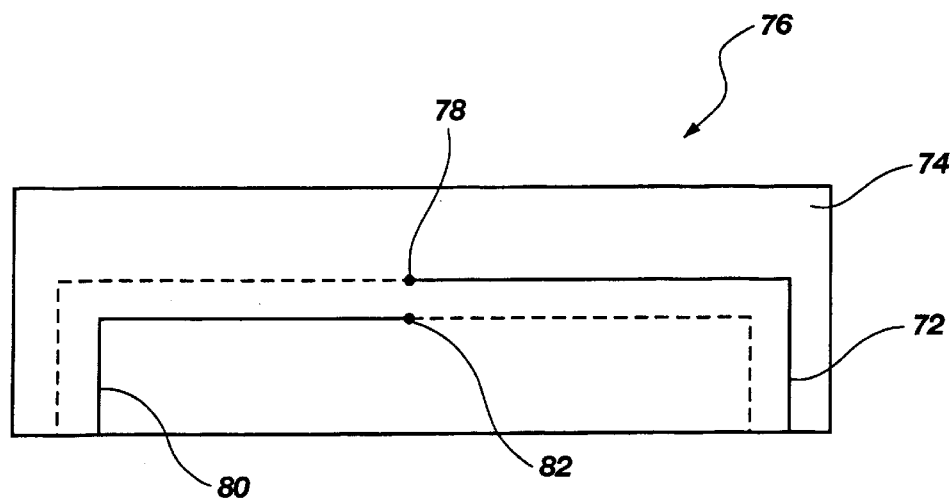
FIG. 7 is an overhead view of a PCB according to a third embodiment of the invention.

In a third embodiment of the present invention, as shown in FIG. 7, a first circuit trace 72 travels the first half of its length along a first side 74 of a printed circuit board (PCB) 76 and then travels through a first via 78 to a second side (not shown other than by dashed lines to indicate the second side traces) of the PCB 76 for the second half of its length. A second circuit trace 80 travels the first half of its length along the second side (not shown other than by dashed lines to indicate the second side traces) of the PCB 76 and then travels through a second via 82 to the first side 74 of the PCB for the second half of its length. As with the previous embodiments, transmitting signals across the dielectric material in this pattern compensates for the propagation delay, which is heavily affected by the dielectric constant of the dielectric material over which the signals travel. The PCB system compensates for the propagation delay by allowing multiple signals to travel over material with the same dielectric constant without the cost of setting the specifications for the material so narrowly. FIG. 7 shows the circuit traces 72 and 80 laterally spaced from each other to more easily distinguish between the traces. However, to more closely match the lengths of the traces over the same dielectric material, the circuit trace patterns are preferably placed very close together or, because they are traveling on opposite sides of the PCB 76, most preferably, placed along a mirrored path with minor variances at a midpoint to allow the signals to be isolated from each other as they pass through vias 78 and 82.

Figure 8:
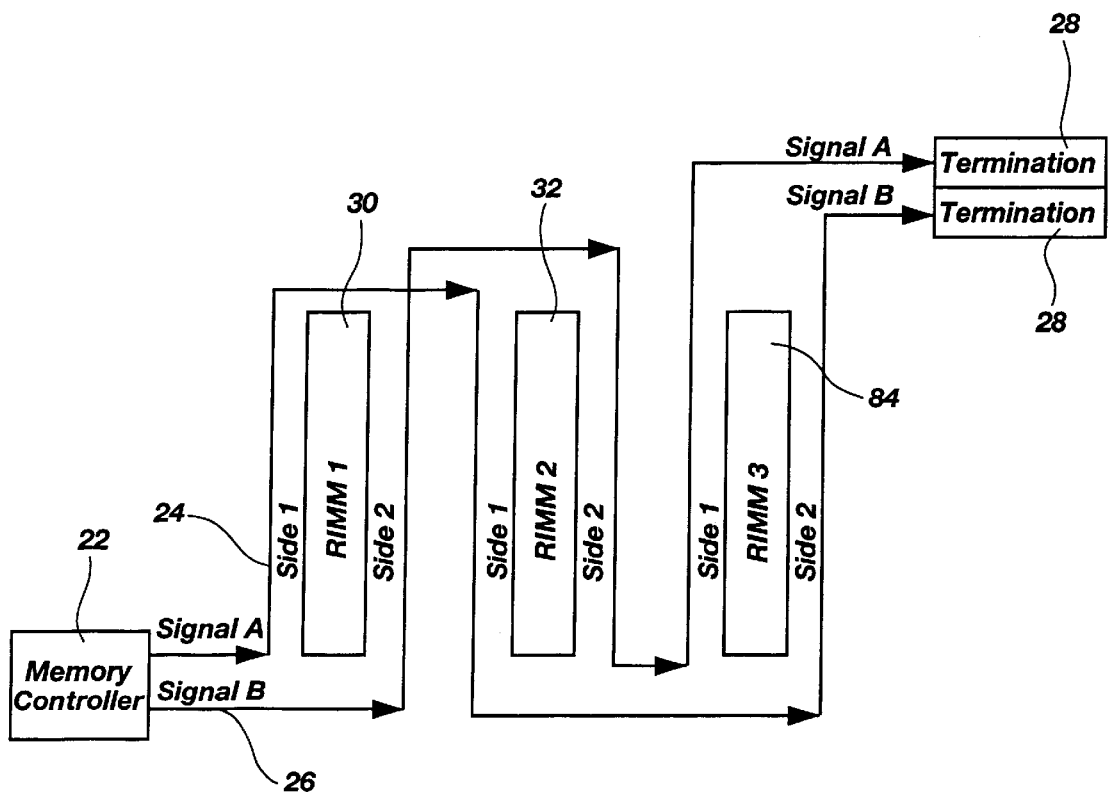
FIG. 8 is a block diagram of a three-RIMM Rambus-type memory system.

FIG. 8 shows a Rambus-type system configuration like that of FIG. 3 using RIMMs fabricated from PCBs patterned and cut as with the array 50 depicted in FIG. 5, but including a third RIMM 84. In the embodiment shown in FIG. 8, as with the previously described embodiments, the skew between respective Signals A 24 and B 26 caused by the different dielectric constants of the material used for Sides 1 and 2 of RIMM 1 30 is compensated for by a different skew caused by the different dielectric constants of the material used for Sides 1 and 2 of RIMM 2 32. Because RIM 2 32 compensates for the propagation delay of RIMM 1 30 by canceling the skew, there is, effectively, no skew present between the respective Signals A 24 and B 26 as they enter RIMM 3 84. In this embodiment, because there is no fourth RIMM to compensate for any skew caused by the different dielectric materials in Sides 1 and 2 of RIMM 3 84, there is no particular need to select RIMM 3 84 from a particular array or having particular dielectric constants, so long as the skew caused by Signals A 24 and B 26 traveling along different sides of RIMM 3 84 does not exceed the overall tolerance allowed for the system. Therefore, while the PCBs used for RIMM 1 30 and RIMM 2 32 should be matched by coming from the same panel or same array according to the present invention, REMM 3 84 may be from the same, or a different panel or array. A PCB patterned according to the embodiment shown in FIG. 7 and described in relation thereto, however, would be advantageous as RIM 3 84 because it does not require a second, matching RIMM to compensate for the propagation delay caused by the dielectric materials used for the respective sides of the PCB of that RIMM.

Contrarily, if a fourth RIMM were used in the system shown in FIG. 8, it would most preferably be fabricated from a PCB patterned and cut as with the array 50 depicted in FIG. 5 such that the propagation delay caused by the respective signals traveling along the dielectric constants of the material used for the respective sides of RIMM 4 could compensate for the propagation delay caused by RIMM 3 84 as discussed with the various embodiments of the present invention. As will be clear to one of skill in the art, for any even number of printed circuit boards used in a system, the boards may be matched according to this invention to cancel skew.

As will further be clear to one of skill in the art, the specific alternating patterns of RIMM sides and array sides shown and discussed in relation to the foregoing Figures are not required to achieve the advantages of the present invention. It is most preferable to match RIMMs which were physically closer in location to each other on a given PCB layout of an array or panel before they were cut to ensure, in most instances, a closer match of dielectric constants within a specific PCB. It is believed, however, that there is sufficient uniformity of the dielectric constant within a given side of a PCB panel or array to match a RIMM or array with one anywhere on the same PCB panel or array. This matching of PCBs used for specific RIMMs, therefore, may be accomplished using any number of patterns of alternating or adjacent PCBs within common arrays or panels.

Figure 9:
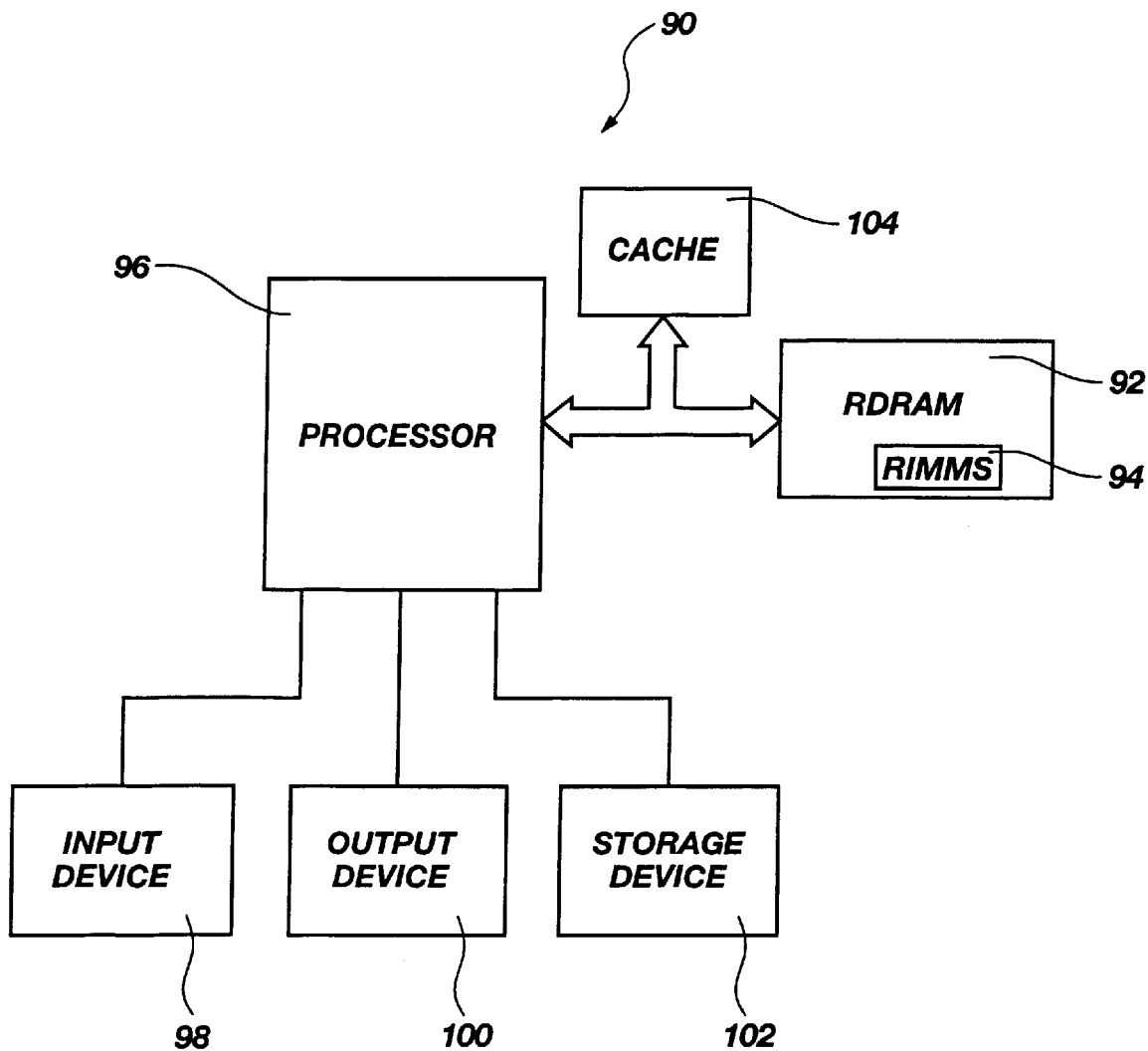
FIG. 9 is a block diagram of an electronic system including memory fabricated according to an embodiment of the present invention.

FIG. 9 is a block diagram of an electronic system 90 which includes RDRAM 92 comprising RIMMs 94 including at least two printed circuit boards matched according to the invention. The electronic system 90 includes a processor 96 for performing various computing functions, such as executing specific software to perform specific calculations or tasks. Additionally, the electronic system 90 includes one or more input devices 98, such as a keyboard or a mouse, coupled to the processor 96 to allow an operator to interface with the electronic system 90. Typically, the electronic system 90 also includes one or more output devices 100 coupled to the processor 96, such output devices typically being a printer, a video terminal or a network connection. One or more data storage devices 102 are also typically coupled to the processor 96 to store data or retrieve data from external storage media (not shown). Examples of typical storage devices 102 include hard and floppy disks, tape cassettes, and compact disks. The processor 96 is also typically coupled to a cache memory 104, which is conventionally static random access memory ("SRAM"), and to the RDRAM 92. It will be understood, however, that the propagation delay compensated printed circuit boards of the invention may also be incorporated into any one of the input, output, storage, cache and processor devices 96, 98, 100, 102 and 104.

One potential added expense with using the method of the present invention is the expense of tracking the individual arrays and RIMMs by the array or panel from which they came. However, if the processes for creating the dielectric sheets for use in the printed circuit boards (PCB) can reliably ensure a dielectric constant within an acceptable range, there would be no further need to determine if the dielectric constant of the material is beyond that range to specifically match it with another dielectric sheet. The present invention allows for differences between the dielectric sheets used for a specific panel without requiring the additional cost of matching the dielectric constants of the sheets. Therefore, even in light of the added expense of tracking the individual arrays and RIMMs by the panel or array from which they came, the present invention will likely reduce total cost and certainly provide greater product reliability and repeatability of performance. The arrays or individual PCBs for use as RIMMs may be marked at the time of fabrication, such as by bar coding or merely by numbers, lasers or other indicia visible to an operator to distinguish them later.

Although the invention is shown and described primarily with reference to Rambus-type memory systems using RDRAK, the use of the present invention to compensate for skew in other memory or nonmemory systems are also contemplated within the scope of this disclosure. It is believed that adaptation from the disclosure herein to different architectures and applications will be clear to one of skill in the art. The invention helps reduce propagation delay caused by signal travel through different signal paths of a printed circuit board. Therefore, the present invention will be advantageous in any electronic system where compensation for differences in propagation delay along different signal paths is desired.

Although the present invention has been shown and described with reference to particular preferred embodiments, various additions, deletions and modifications that are obvious to a person skilled in the art to which the invention pertains, even if not shown or specifically described herein, are deemed to lie within the scope of the invention as encompassed by the following claims.

What is claimed is:

1. A method of reducing signal skew within an electronic system, the method comprising:

transmitting at least a first signal through a first circuit trace adjacent a dielectric material having a first dielectric constant;

transmitting the at least a first signal through a second circuit trace adjacent a dielectric material having a second dielectric constant different from the first dielectric constant;

transmitting at least a second signal through a third circuit trace adjacent a dielectric material having a dielectric constant substantially equal to the second dielectric constant; and transmitting the at least a second signal through a fourth circuit trace adjacent a dielectric material having a dielectric constant substantially equal to the first dielectric constant.

2. The method of claim 1, wherein transmitting comprises transmitting from a memory controller.

3. The method of claim 1, further comprising:

transmitting the at least a first signal through a via prior to transmitting the at least a first signal through the second circuit trace; and transmitting the at least a second signal through a via prior to transmitting the at least a second signal through the fourth circuit trace.

4. The method of claim 3, including forming the first, second, third and fourth circuit traces on a common printed circuit board.

5. A method of compensating for propagation delay within an RDRAM system, the method comprising:

selecting a first RIMM comprising a first side characterized by a first dielectric constant and a second side characterized by a second dielectric constant; and selecting a second RIMM comprising a first side characterized by the second dielectric constant and a second side characterized by the first dielectric constant.

6. The method of claim 5, further comprising:

transmitting a first signal along a length of the first side of the first RIMM and along a length of the first side of the second RIMM; and transmitting a second signal along a length of the second side of the first RIMM and along a length of the second side of the second RIMM.

7. An electronic system comprising:

a memory controller;

at least one signal termination;

a first memory module including a circuit board having a first side characterized by a first dielectric constant and a second side characterized by a second dielectric constant;

a second memory module including a circuit board having a first side characterized by a dielectric constant substantially the same as the second dielectric constant and a second side characterized by a dielectric constant substantially the same as the first dielectric constant;

at least a first conductive path extending from the memory controller, along a portion of the first side of the first memory module and a portion of the first side of the second memory module, to at least a first of the at least one signal termination; and at least a second conductive path extending from the memory controller, along a portion of the second side of the first memory module and a portion of the second side of the second memory module, to at least a second of the at least one signal termination.

8. The electronic system of claim 7, further comprising a third memory module, wherein the at least a first conductive path further extends from the first side of the second memory module to a first side of the third memory module before extending to the at least the first of the at least one signal termination, and the at least a second conductive path further extends from the second side of the second memory module to a second side of the third memory module before extending to the at least the second of the at least one signal termination.

9. The electronic system of claim 7, wherein the first memory module and the second memory module are each RIMMs.

10. The electronic system of claim 7, wherein the first memory module and the second memory module are both modules from a common printed circuit board array.

11. The electronic system of claim 7, wherein the first memory module and the second memory module are both modules from a common printed circuit board panel.

12. The electronic system of claim 7, wherein the at least a first conductive path and the at least a second conductive path comprise circuit traces on a printed circuit board.

13. An electronic system comprising:
- at least a first conductive path having a first portion adjacent a first portion of a dielectric material characterized by a first dielectric constant, and a second portion adjacent a first portion of a dielectric material characterized by a second dielectric constant; and
- at least a second conductive path having a first portion adjacent a second portion of the dielectric material characterized by the first dielectric constant and a second portion adjacent a second portion of the dielectric material characterized by the second dielectric constant.

14. The electronic system of claim 13, wherein the at least a first conductive path and the at least a second conductive path are printed circuit board traces and the dielectric material characterized by the first dielectric constant and the dielectric material characterized by the second dielectric constant are each layers in at least one printed circuit board structure.

15. The electronic system of claim 14, wherein the at least one printed circuit board structure is a printed circuit board panel.

16. The electronic system of claim 14, wherein the at least one printed circuit board structure is a printed circuit board array.

17. The electronic system of claim 13, wherein the at least a first conductive path consists essentially of the first and second portions of the first conductive path on a printed circuit board structure having two conductive layers, the first and second portions of the first conductive path being joined by a via, and the at least a second conductive path consists essentially of the first and second portions of the second conductive path on the printed circuit board structure, the first and second portions of the second conductive path being joined by a via.

18. The electronic system of claim 14, wherein the at least one printed circuit board structure is two printed circuit boards cut from a common larger printed circuit board structure.

19. The electronic system of claim 18, wherein the common larger printed circuit board structure is a printed circuit board panel.

20. The electronic system of claim 19, wherein a first printed circuit board of the two printed circuit boards comprises a first printed circuit board array on the printed circuit board panel and a second printed circuit board of the two printed circuit boards comprises a second printed circuit board array on the printed circuit board panel.

21. The electronic system of claim 18, wherein the two printed circuit boards are RIMMs in an RDRAM system.

22. A printed circuit board panel layout, the printed circuit board panel including a first side and a second side, the layout comprising a plurality of printed circuit board arrays each having a first side and a second side:
- wherein the first sides of the plurality of printed circuit board arrays each include a first printed circuit trace pattern and the second sides of the plurality of circuit board arrays each include a second printed circuit trace pattern different from the first printed circuit trace pattern; and
- wherein the layout is configured such that at least one array has its first side on the first side of the printed circuit board panel and at least one array has its second side on the first side of the printed circuit board panel.

23. The printed circuit board panel layout of claim 22, wherein a portion of the first printed circuit trace pattern is designed for use as a first side of a double-sided memory module and a portion of the second printed circuit trace pattern is designed for use as a second side of a double-sided memory module.

24. The printed circuit board panel layout of claim 22, wherein half of a total of the plurality of printed circuit board arrays are configured such that the first side of each of the plurality of printed circuit board arrays is on the first side of the printed circuit board panel and half of the plurality of the total of printed circuit board arrays are configured such that the second side of each of the plurality of printed circuit board arrays is on the first side of the printed circuit board panel.

25. The printed circuit board panel layout of claim 22, wherein the first side of each of the plurality of printed circuit board arrays is adjacent at least one second side of one of the plurality of printed circuit board arrays.

26. A printed circuit board array layout for use in fabricating individual printed circuit boards, the layout comprising:
- a first plurality of printed circuit trace patterns on a first side of the printed circuit board array; and
- a second plurality of printed circuit trace patterns on a second side of the printed circuit board array;
- wherein at least a first circuit trace pattern of the first plurality of printed circuit trace patterns is designed for use as a first side of a memory module, and at least a second circuit trace pattern of the first plurality of printed circuit trace patterns is designed for use as a second side of a memory module.

27. The printed circuit board array layout of claim 26, wherein each circuit trace pattern of the at least a first circuit trace pattern comprises a substantially identical circuit trace pattern, and each circuit trace pattern of the at least a second circuit trace pattern comprises a substantially identical circuit trace pattern different from the at least a first circuit trace pattern.

28. The printed circuit board array layout of claim 26, wherein each circuit trace pattern of the at least a first circuit trace pattern is adjacent to at least one circuit trace pattern of the at least a second circuit trace pattern.

29. The printed circuit board array layout of claim 26, wherein the circuit trace patterns of the at least a first circuit trace pattern are arranged in an alternating pattern on the printed circuit board array with the circuit trace patterns from the at least a second circuit trace pattern.

30. A computer system comprising:
- a processor;
- an input device coupled to the processor and adapted to allow data to be input to the processor;
- an output device coupled to the processor and adapted to allow the processor to output data;
- a storage device coupled to the processor adapted to store information for use by the processor; and
- a memory device coupled to the processor for storing data and instructions for use by the processor, the memory device comprising:
  - at least a first memory module including a printed circuit board having a first side characterized by a first dielectric constant and a second side characterized by a second dielectric constant;
  - at least a second memory module including a printed circuit board having a first side characterized by a dielectric constant substantially equal to the second dielectric constant and a second side characterized by a dielectric constant substantially equal to the first dielectric constant;

at least a first conductive path extending a length of the first side of the at least a first memory module and a length of the first side of the at least a second memory module; and at least a second conductive path extending a length of the second side of the at least a first memory module and a length of the second side of the at least a second memory module.

31. The computer system of claim 30, wherein the memory device is an RDRAM device and the at least a first memory module and the at least a second memory module are each RIMMs.

32. The computer system of claim 30, wherein the at least a first memory module and the at least a second memory module each comprise printed circuit boards from a common printed circuit board panel.

33. The computer system of claim 32, wherein the at least a first memory module and the at least a second memory module each comprise printed circuit boards from a common printed circuit board array.

34. The computer system of claim 32, wherein the at least a first memory module and the at least a second memory module each comprise printed circuit boards from different printed circuit board arrays.

35. A method of making a printed circuit board structure for use in a memory module, the method comprising:

etching a first circuit trace pattern, designed for use as a first side of a memory module, on a portion of a first side of a printed circuit board structure;

etching a second circuit trace pattern, designed for use as a second side of a memory module, on a portion of the first side of the printed circuit board structure;

etching the first circuit trace pattern on a portion of a second side of the printed circuit board structure; and etching the second circuit trace pattern on a portion of the second side of the printed circuit board structure.

36. The method of claim 35, including forming the printed circuit board structure as a printed circuit board panel.

37. The method of claim 35, including forming the printed circuit board structure as a printed circuit board array.

38. The method of claim 35, further comprising cutting the printed circuit board structure into individual printed circuit boards such that at least one first circuit trace pattern on the first side of the printed circuit board structure is on a first printed circuit board and at least one second circuit trace pattern is on a second side of the first printed circuit board.

39. A method of making a memory module system, the method comprising:

selecting a first printed circuit board including a first side having a dielectric material characterized by a first dielectric constant and a second side having a dielectric material characterized by a second dielectric constant;

selecting a second printed circuit board including a first side having a dielectric material characterized by a dielectric constant substantially equal to the second dielectric constant and over a dielectric material characterized by a dielectric constant substantially equal to the first dielectric constant;

extending a first conductive trace over the first side of each of the first and second printed circuit boards; and extending a second conductive trace over the second side of each of the first and second printed circuit boards.

40. The method of claim 39, wherein selecting comprises selecting the first and second printed circuit boards from a common printed circuit board panel on which each is fabricated.

41. The method of claim 39, wherein selecting comprises selecting the first and second printed circuit boards from a common printed circuit board array on which each is fabricated.

* * * * *

UNITED STATES PATENT AND TRADEMARK OFFICE
CERTIFICATE OF CORRECTION

PATENT NO. : 6,484,299 B1
DATED : November 19, 2002
INVENTOR(S) : Corey L. Larsen It is certified that error appears in the above-identified patent and that said Letters Patent is hereby corrected as shown below:

Column 2,
Line 30, change "micro strip" to -- microstrip --

Column 3,
Line 40, before "to" delete "for"

Column 6,
Line 60, change "RIM:M" to -- RIMM --
Line 62, change "RAMM" to -- RIMM --

Column 8,
Line 11, change "REMM" to -- RIMM --

Column 9,
Line 26, change "RDRAK" to -- RDRAM --

Signed and Sealed this

Twenty-seventh Day of May, 2003

JAMES E. ROGAN
*Director of the United States Patent and Trademark Office*